(12) United States Patent
Kim

(10) Patent No.: US 9,754,887 B2
(45) Date of Patent: Sep. 5, 2017

(54) SEMICONDUCTOR DEVICES

(71) Applicant: Samsung Electronics Co., Ltd., Suwon-si (KR)

(72) Inventor: Min-Su Kim, Bansong-Dong (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/058,676

(22) Filed: Mar. 2, 2016

(65) Prior Publication Data

US 2016/0358856 A1 Dec. 8, 2016

(30) Foreign Application Priority Data

Jun. 4, 2015 (KR) .................. 10-2015-0079252

(51) Int. Cl.
| | | |
|---|---|---|
| *H01L 27/118* | (2006.01) | |
| *H01L 23/528* | (2006.01) | |
| *H01L 27/092* | (2006.01) | |
| *H01L 29/78* | (2006.01) | |
| *H01L 29/08* | (2006.01) | |

(52) U.S. Cl.
CPC ...... *H01L 23/5286* (2013.01); *H01L 27/0924* (2013.01); *H01L 27/11807* (2013.01); *H01L 29/0847* (2013.01); *H01L 29/7848* (2013.01); *H01L 2224/16225* (2013.01); *H01L 2224/48091* (2013.01); *H01L 2224/48227* (2013.01); *H01L 2924/15311* (2013.01)

(58) Field of Classification Search
CPC ............. H01L 23/5226; H01L 29/7848; H01L 29/0847; H01L 23/5286; H01L 27/0924; H01L 2224/16225; H01L 2224/48091; H01L 2224/48227; H01L 2924/15311; H01L 2224/00014
USPC ........ 257/202, 190, 207, 774, 776; 438/637, 438/629
See application file for complete search history.

(56) References Cited

U.S. PATENT DOCUMENTS

| | | | |
|---|---|---|---|
| 5,789,807 A | | 8/1998 | Correale, Jr. |
| 6,437,441 B1 | * | 8/2002 | Yamamoto ........ H01L 21/76801 257/262 |
| 7,002,252 B2 | * | 2/2006 | Yamamoto ........ H01L 21/76801 257/259 |
| 7,219,324 B1 | | 5/2007 | Sherlekar et al. |
| 7,755,396 B2 | | 7/2010 | Shin et al. |
| 7,760,578 B2 | | 7/2010 | Vinke et al. |
| 7,986,036 B2 | | 7/2011 | Chen |
| 7,989,849 B2 | | 8/2011 | Sherlekar et al. |
| 8,174,052 B2 | | 5/2012 | Kim et al. |
| 8,266,568 B2 | | 9/2012 | Chuang |

(Continued)

*Primary Examiner* — Thinh T Nguyen
(74) *Attorney, Agent, or Firm* — Onello & Mello, LLP

(57) ABSTRACT

A semiconductor device includes a first power rail, a second power rail, at least one standard cell and at least one power bridge. The first power rail extends in a first direction over a substrate. The second power rail extends in the first direction over the substrate, and the second power rail is spaced apart from the first power rail in a second direction that intersects the first direction. The at least one standard cell receives a first voltage from the first and the second power rails. The at least one power bridge connects the first power rail and the second power rail in the second direction. The first power rail and the second power rail are formed in a first metal layer and the least one power bridge is formed in a bottom metal layer that is under the first metal layer.

16 Claims, 17 Drawing Sheets

(56) References Cited

U.S. PATENT DOCUMENTS

| | | | |
|---|---|---|---|
| 8,726,216 B2 | 5/2014 | Suzuki et al. | |
| 8,987,816 B2 | 3/2015 | Stephens et al. | |
| 2002/0140001 A1* | 10/2002 | Komaki | H01L 27/11807 257/207 |
| 2002/0158339 A1* | 10/2002 | Yamamoto | H01L 21/76801 257/758 |
| 2007/0168899 A1* | 7/2007 | Frenkil | G06F 17/5068 257/773 |

* cited by examiner

SEMICONDUCTOR DEVICES

CROSS-REFERENCE TO RELATED APPLICATION

This U.S. non-provisional application claims priority under 35 U.S.C. §119 to Korean Patent Application No. 10-2015-0079252, filed on Jun. 4, 2015, in the Korean Intellectual Property Office (KIPO), the contents of which are herein incorporated by reference in their entirety.

BACKGROUND

1. Technical Field

Some example embodiments may relate generally to semiconductor fields. More specifically, some example embodiments may relate to semiconductor devices.

2. Description of the Related Art

In general, soft core (for example, behavioral or RTL code) may perform place and routing (P&R) using standard libraries in order to design semiconductor chips. A set of conventional library cells may include basic cells such as AND, OR, NOR, INVERTER, and the like, complex cells, such as OAI (OR/AND/INVERTER), AOI (AND/OR/INVERTER), and the like, and storage elements such as master-slave flip-flop, latch, and the like.

As the complexity of the semiconductor chips become higher, a number of metal stacks providing power to the semiconductor chip becomes greater.

SUMMARY

Some example embodiments provide a semiconductor device capable of stably supplying power, while reducing a number of metal stacks.

According to an aspect of the present inventive concepts, a semiconductor device includes a first power rail, a second power rail, at least one standard cell and at least one power bridge. The first power rail extends in a first direction over a substrate having a first conductive type. The second power rail extends in the first direction over the substrate, and the second power rail is spaced apart from the first power rail by a predetermined distance in a second direction that intersects the first direction. The at least one standard cell receives a first voltage from the first power rail and the second power rail. The at least one power bridge connects the first power rail and the second power rail in the second direction within the at least one standard cell. The first power rail and the second power rail are formed in a first metal layer and the least one power bridge is formed in a bottom metal layer that is under the first metal layer.

In some embodiments, the semiconductor device may further include a third power rail extending in the first direction between the first power rail and the second power rail. The third power rail is formed in the first metal layer and the third power rail provides a second voltage different from the first voltage.

In some embodiments, the semiconductor device may further include at least one first branch portion and at least one second branch portion. The at least one first branch portion may protrude from the first power rail toward the third power rail, and the at least one first branch portion may extend in the second direction such that the at least one first branch portion is spaced apart from the third power rail in the second direction. The at least one second branch portion may protrude from the second power rail toward the third power rail, and the at least one second branch portion may extend in the second direction such that the at least one second branch portion is spaced apart from the third power rail in the second direction.

In some embodiments, each width of the at least one first branch portion and the at least one second branch portion may be substantially the same as a width of the at least one power bridge.

In some embodiments, the at least one power bridge may include a first power bridge and a second power bridge that are spaced apart from each other in the first direction. The at least one first branch portion may include a first branch portion and a second branch portion that are spaced apart from each other in the first direction. The at least one second branch portion may include a third branch portion and a fourth branch portion that are spaced apart from each other in the first direction.

In some embodiments, each width of the at least one first branch portion and the at least one second branch portion may be greater than a width of the at least one power bridge.

In some embodiments, the at least one first branch portion may be connected to the at least one power bridge through a first contact, the at least one second branch portion may be connected to the at least one power bridge through a second contact, and the at least one first branch portion and the at least one second branch portion may reduce a resistance of the at least one power bridge.

In some embodiments, the semiconductor device may further include a first well and the second well. The first well may be formed in the substrate, and the first well may have a second conductive type. The second well may be formed in the substrate separately from the first well, and the second well may have the second conductive type. The first power rail may be formed over the first well. The second power rail may be formed over the second well.

In some embodiments, the first conductive type may be p-type and the second conductive type may be n-type.

In some embodiments, the semiconductor device may further include a first impurity region, a second impurity region and a gate electrode. The first impurity region may be formed in the first well within the standard cell. The second impurity region may be formed in the second well within the standard cell. The gate electrode may cross the first impurity region and the second impurity region in the second direction.

In some embodiments, the at least one power bridge partially may overlap with the gate electrode in a third direction orthogonal to the first direction and the second direction, and the at least one power bridge may be formed higher than the gate electrode in the third direction.

In some embodiments, the first impurity region, the second impurity region and the gate electrode may constitute a plurality of transistors, and the plurality of transistors may operate as a decoupling capacitor.

According to another aspect of the present inventive concepts, a semiconductor device includes a first power rail, a second power rail, an active fin and at least one power bridge. The first power rail extends in a first direction over a substrate having a first conductive type. The second power rail extends in the first direction over the substrate, and the second power rail is spaced apart from the first power rail by a predetermined distance in a second direction that intersects the first direction. The active fin protrudes from the substrate, and the active fin extends in the first direction. The at least one power bridge connects the first power rail and the second power rail in the second direction within at least one standard cell having a cell boundary defined by the first power rail and the second power rail.

In some embodiments, the semiconductor device may further include a gate structure and an impurity region. The gate structure may be formed in the active fin, and the gate structure may extends in the second direction. The impurity region may be formed in a recess formed in the active fin.

In some embodiments, the impurity region may be elevated with respect to the active fin.

According to another aspect of the present inventive concepts, a semiconductor device may include a first power rail extending in a first direction over a substrate in a first metal layer, a second power rail extending in the first direction over the substrate spaced apart from the first power rail in a second direction that intersects with the first direction in the first metal layer, a third power rail extending in the first direction over the substrate between the first power rail and the second power rail and at least one power bridge extending in the second direction in a second metal layer below the first metal layer and configured to connect the first and second power rails in at least one standard cell.

In some embodiments, at least one standard cell has a cell boundary defined by the first power rail and the second power rail and receives a first voltage from the first power rail and the second power rail.

In some embodiments, the third power rail is formed in the first metal layer and the third power rail provides a second voltage different from the first voltage.

In some embodiments, the semiconductor device further includes at least one first branch portion protruding from the first power rail toward the third power rail, the at least one first branch portion extending in the second direction such that the at least one first branch portion is spaced apart from the third power rail in the second direction, and at least one second branch portion protruding from the second power rail toward the third power rail, the at least one second branch portion extending in the second direction such that the at least one second branch portion is spaced apart from the third power rail in the second direction.

In some embodiments, the semiconductor device further includes a first well formed in the substrate having a first conductive type, the first well having a second conductive type and a second well formed in the substrate separately from the first well, the second well having the second conductive type. The first power rail is formed over the first well, and the second power rail is formed over the second well.

According to some example embodiments, a first power rail and a second power rail, which provide powers to a plurality of transistors in a standard cell of a semiconductor device, are formed in a first metal layer and at least one power bridge, which connects the first power rail to the second power rail, is formed in a bottom metal layer under the first metal layer. Therefore, the semiconductor device may supply the powers stably while reducing a number of metal stacks and may enhance signal routing capability.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
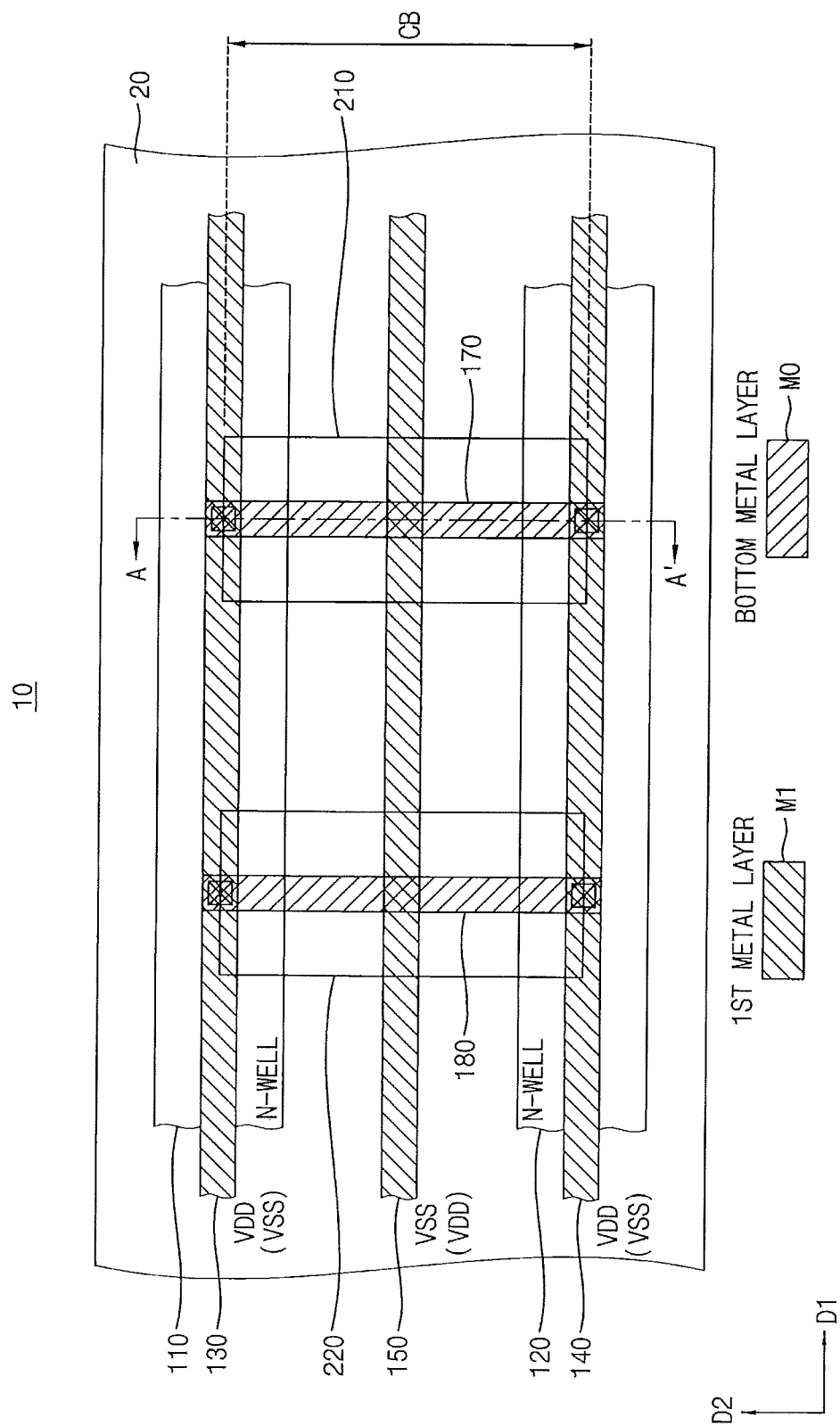
FIG. 1 illustrates a semiconductor device according to some example embodiments.

Various example embodiments will be described more fully with reference to the accompanying drawings, in which some example embodiments are shown. The present inventive concepts may, however, be embodied in many different forms and should not be construed as limited to the embodiments set forth herein. It will be understood that when an element is referred to as being "on," "connected to," or "coupled to" to another element or layer, it may be directly on, connected to or coupled to the other element or layer or intervening elements or layers may be present. In contrast, when an element or layer is referred to as being "directly on," "directly connected to" or "directly coupled to" another element or layer, there are no intervening elements or layers present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of the present inventive concepts.

Spatially relative terms, such as "beneath," "below," "lower," "above," "upper," and the like may be used herein for ease of description to describe one element's or feature's relationship to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made to example embodiments, which are illustrated in the accompanying drawings, wherein like reference numerals may refer to like components throughout.

FIG. 1 illustrates a semiconductor device according to some example embodiments.

Referring to FIG. 1, a semiconductor device 10 may include a semiconductor substrate 20, a first power rail 130, a second power rail 140, a third power rail 150, a first N-well 110, a second N-well 120, standard cells 210 and 220 and at least one power bridge(s), for example, first and second power bridges 170 and 180. The semiconductor device 10 may include a first power bridge 170 and a second power bridge 180; however, the present inventive concepts are not limited thereto.

The substrate 20 may have a first conductive type. The substrate 20 may be formed of one or more semiconductor materials selected from the group comprising Si, Ge, SiGe, GaP, GaAs, SiC, SiGeC, InAs and InP.

The first power rail 130 extends in a first direction D1 over the substrate 20. The second power rail 140 extends in the first direction D1 over the substrate 20 and is spaced apart from the first power rail 130 by a predetermined distance in a second direction D2 that intersects the first direction D1. The second direction D2 is substantially perpendicular to the first direction D1. The third power rail 150 extends in the first direction D1 between the first power rail 130 and the second power rail 140 such that the third power rail 150 is spaced apart from both the first and second power rails 130 and 140 in the second direction D2.

In some example embodiments, the first power rail 130 and the second power rail 140 may provide a first voltage, for example, a power supply voltage VDD, to the standard cells 210 and 220, and the third power rail 150 may provide a second voltage V2, for example, a ground voltage VSS, different from the first voltage V1 to the standard cells 210 and 220. The first through third power rails 130, 140 and 150 may be formed in a first metal layer M1 in the semiconductor device 10.

The first N-well 110 and the second N-well 120 may be formed separately from each other in the substrate 20 and may have a second conductive type. The first power rail 130 may be formed over the first N-well 110 and the second power rail 140 may be formed over the second N-well 120. Each of the first N-well 110 and the second N-well 120 may be, for example, an epitaxial layer formed of a semiconductor material. The epitaxial layer may be formed on, for example, an insulating substrate. That is, each of the first N-well 110 and the second N-well 120 may be formed as a silicon-on-insulator (SOI).

Each of the standard cells 210 and 220 may have a cell boundary CB defined by the first power rail 130 and the second power rail 140. The cell boundary may be a boundary of the standard cells 210 and 220 along the first direction D1.

The first power bridge 170 may connect the first power rail 130 and the second power rail 140 with respect to each other in the second direction D2 in the standard cell 210 and the second power bridge 180 may connect the first power rail 130 and the second power rail 140 with respect to each other in the second direction D2 in the standard cell 220. The first and second power bridges 170 and 180 may be formed in a bottom metal layer M0 formed under the first metal layer M1 in the semiconductor device 10.

When the first power rail 130 and the second power rail 140 are connected to each other using the first and second power bridges 170 and 180 formed in the bottom metal layer M0 under the first metal layer M1 without using upper metal layers formed above the first metal layer M1, signal routing capability of the semiconductor device 10 may be increased and manufacturing cost of the semiconductor device 10 may be reduced.

Figure 2:
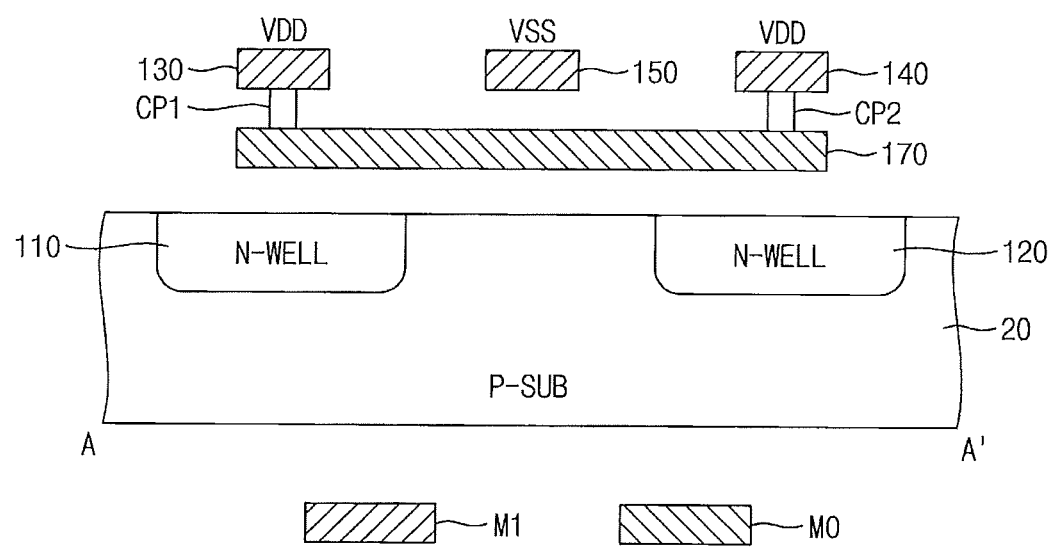
FIG. 2 is a cross-sectional view taken along the line A-A' of the semiconductor device of FIG. 1.

FIG. 2 is a cross-sectional view taken along the line A-A' of the semiconductor device of FIG. 1.

Referring to FIG. 2, the first N-well 110 and the second N-well 120 are formed separately from each other in the substrate 20 having a first conductive type, for example, p-type, the first through third power rails 130, 140 and 150 are formed in the first metal layer M1, and the first power bridge 170 is formed in the bottom metal layer M0 under the first metal layer M1 to connect the first power rail 130 to the second power rail 140 in the second direction D2. The first power rail 130 is connected to the first power bridge 170 through a first contact plug CP1 and the second power rail 140 is connected to the first power bridge 170 through a second contact plug CP2. In some embodiments, although not illustrated, some portion of the first power bridge 170 may be formed in the bottom metal layer M0 and other portion of the first power bridge 170 may be formed in the first metal layer M1. In some embodiments, although not illustrated, at least some portion of the first power bridge 170 may be formed in the bottom metal layer M0. In some embodiments, although not illustrated, some portion of the second power bridge 180 may be formed in the bottom metal layer M0 and other portion of the second power bridge 180 may be formed in the first metal layer M1. In some embodiments, although not illustrated, at least some portion of the second power bridge 180 may be formed in the bottom metal layer M0.

Figure 3:
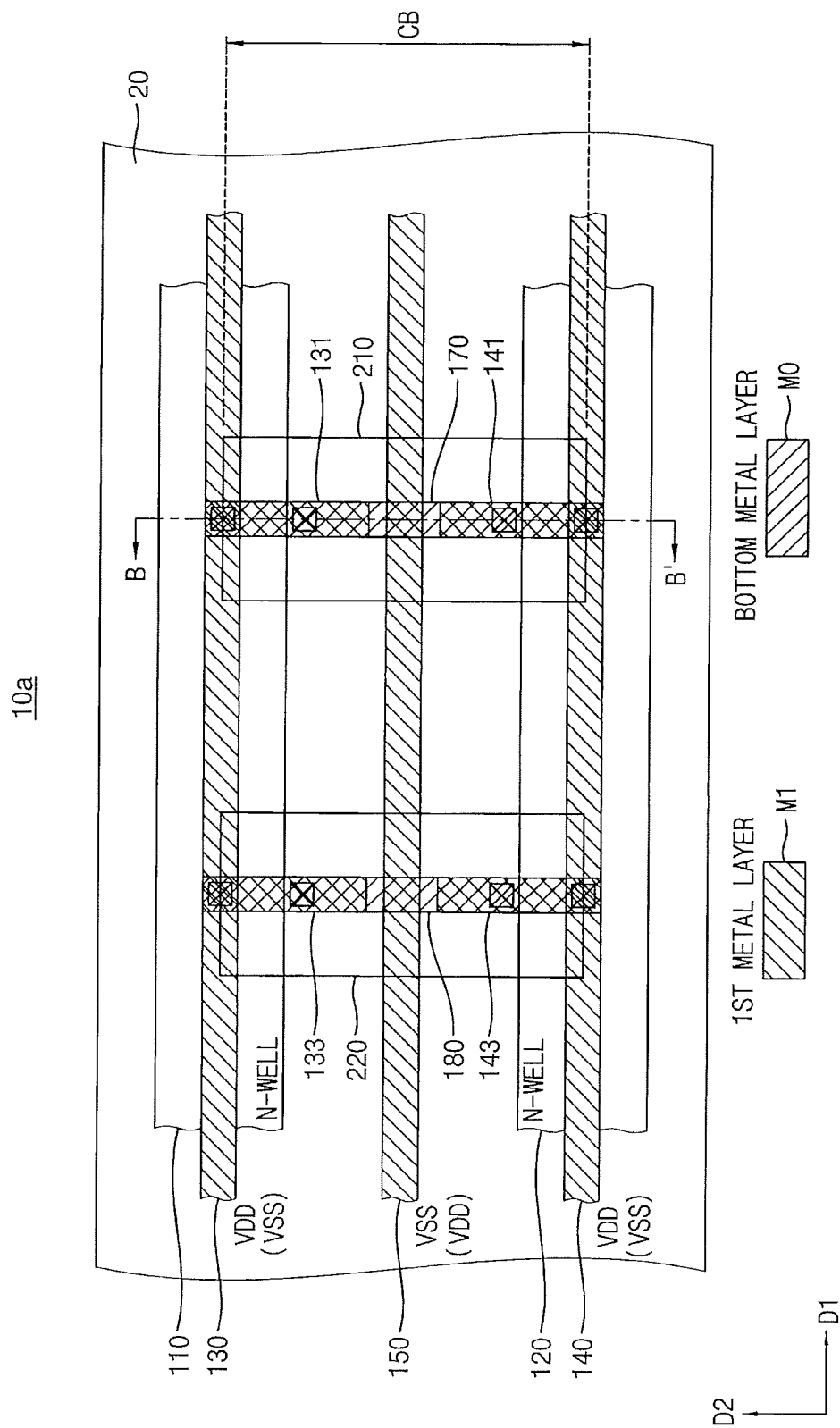
FIG. 3 illustrates a semiconductor device according to some example embodiments.

FIG. 3 illustrates a semiconductor device according to some example embodiments.

A semiconductor device 10a of FIG. 3 differs from the semiconductor device 10 of FIG. 1 in that the semiconductor device 10a further includes a plurality of branch portions, for example, first branch portion 131, second branch portion 141, third branch portion 133 and fourth branch portion 143.

Referring to FIG. 3, the standard cell 210 may further include the first branch portion 131 and the second branch portion 141 and the standard cell 220 may further include the third branch portion 133 and the fourth branch portion 143.

The first branch portion 131 may protrude from the first power rail 130 toward the third power rail 150 and may extend in the second direction D2 such that the first branch portion 131 overlaps with the first power bridge 170 without reaching the third power rail 150 in the standard cell 210. That is, the first branch portion 131 is spaced apart from the third power rail 150 in the second direction D2. The second branch portion 141 may protrude from the second power rail 140 toward the third power rail 150 and may extend in the second direction D2 such that the second branch portion 141 overlaps with the first power bridge 170 without reaching the third power rail 150 in the standard cell 210. That is, the second branch portion 141 is spaced apart from the third power rail 150 in the second direction D2. The third branch portion 133 may protrude from the first power rail 130 toward the third power rail 150 and may extend in the second direction D2 such that the third branch portion 133 overlaps with the second power bridge 180 without reaching the third power rail 150 in the standard cell 220. That is, the third branch portion 133 is spaced apart from the third power rail 150 in the second direction D2. The fourth branch portion 143 may protrude from the second power rail 140 toward the third power rail 150 and may extend in the second direction D2 such that the fourth branch portion 143 overlaps with the second power bridge 180 without reaching the third power rail 150 in the standard cell 220. The first through fourth branch portions 131, 141, 133 and 143 may be formed in the first metal layer M1.

In addition, each width of the first and second branch portions 131 and 141 may be substantially the same as the first power bridge 170 and each width of the third and fourth branch portions 133 and 143 may be substantially the same as the second power bridge 180.

Figure 4:
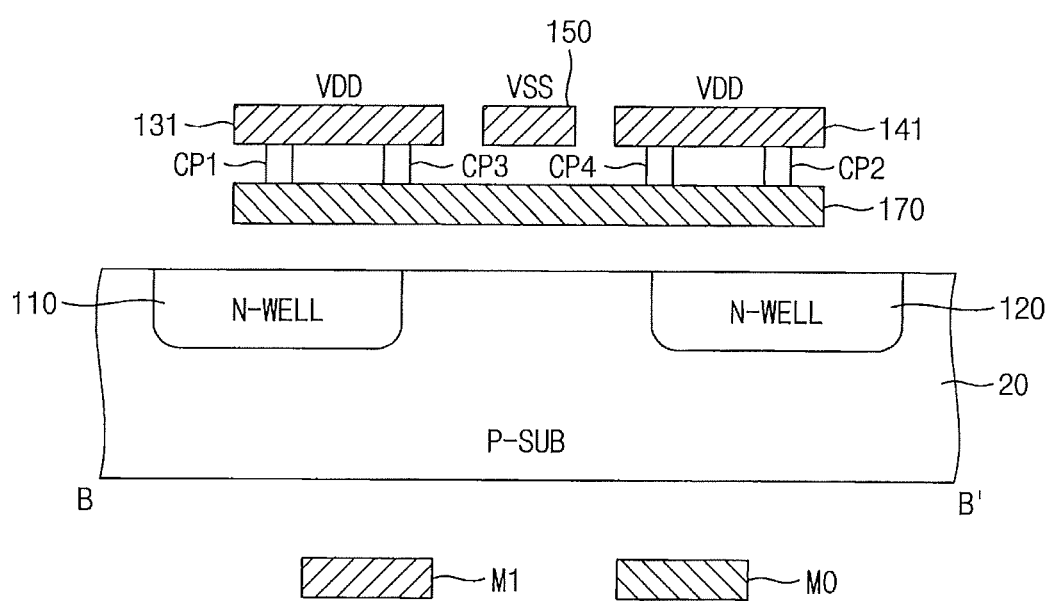
FIG. 4 is a cross-sectional view taken along the line B-B' of the semiconductor device of FIG. 3.

FIG. 4 is a cross-sectional view taken along the line B-B' of the semiconductor device of FIG. 3.

Referring to FIG. 4, the first N-well 110 and the second N-well 120 are formed separately from each other in the substrate 20 having a first conductive type, for example p-type, the first branch portion 131 is formed in the first metal layer M1 with the first branch portion 131 protruding from the first power rail 130 toward the third power rail 150, and the second branch portion 141 is formed in the first metal layer M1 with the second branch portion 141 protruding from the second power rail 140 toward the third power rail 150. The first power bridge 170 is formed in the bottom metal layer M0 under the first metal layer M1 to connect the first power rail 130 to the second power rail 140 in the second direction D2. The first branch portion 131 is connected to the first power bridge 170 through first and third contact plugs CP1 and CP3 and second branch portion 141 is connected to the first power bridge 170 through second and fourth contact plugs CP2 and CP4. When the first branch portion 131 is connected to the first power bridge 170 through first and third contact plugs CP1 and CP3 and the second branch portion 141 is connected to the first power bridge 170 through second and fourth contact plugs CP2 and CP4, a resistance of the first power bridge 170 may be reduced as in a case when resistors are connected in parallel.

Figure 5:
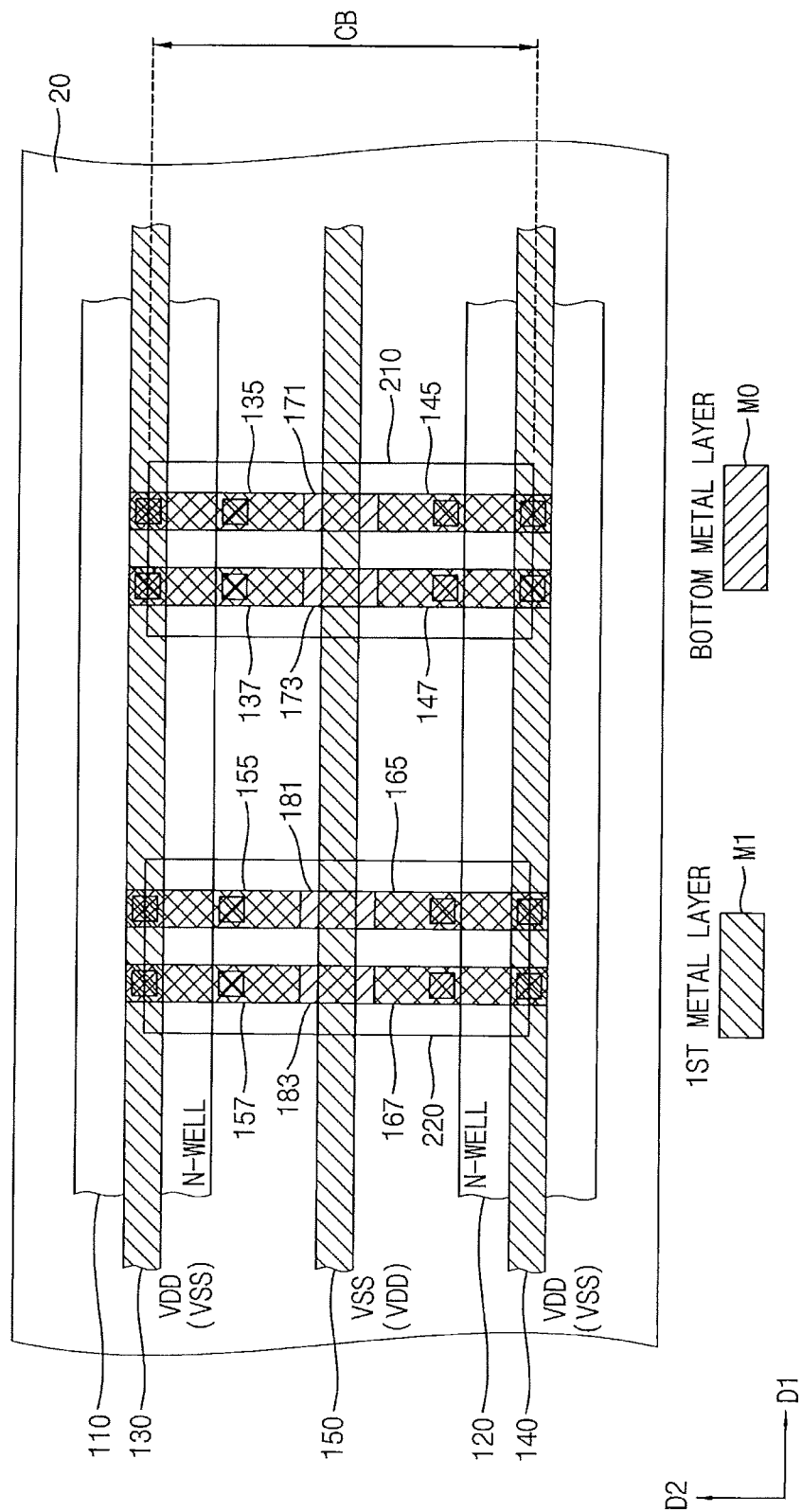
FIG. 5 illustrates a semiconductor device according to some example embodiments.

FIG. 5 illustrates a semiconductor device according to some example embodiments.

A semiconductor device 10b of FIG. 3 differs from the semiconductor device 10 of FIG. 1 in that the semiconductor device 10b further includes a plurality of branch portions, for example, first through eighth branch portions 135, 137, 145, 147, 155, 157, 165 and 167, each of first and second power bridges 171 and 173 connects the first power rail 130 to the second power rail 140 in the standard cell 210 and each of third and fourth power bridges 181 and 183 connects the first power rail 130 to the second power rail 140 in the standard cell 220.

Referring to FIG. 5, the standard cell 210 may further include the plurality of first through fourth branch portions 135, 137, 145 and 147, and the first and second power bridges 171 and 173 connect the first power rail 130 to the second power rail 140 in the standard cell 210. The standard cell 220 may also include, for example, the plurality of fifth through eighth branch portions 155, 157, 165 and 167. The third and fourth power bridges 181 and 183 connect the first power rail 130 to the second power rail 140 in the standard cell 220.

The first and second branch portions 135 and 137 are spaced apart from each other in the first direction D1 in the standard cell 210. Each of the first and second branch portions 135 and 137 may protrude from the first power rail 130 toward the third power rail 150 and may extend in the second direction D2 such that the each of the first and second branch portions 135 and 137 overlaps with each of the first and second power bridges 171 and 173 without reaching the third power rail 150. That is, the first and second branch portions 135 and 137 are spaced apart from the third power rail 150 in the second direction D2. The third and fourth branch portions 145 and 147 are spaced apart from each other in the first direction D1 in the standard cell 210. Each of the third and fourth branch portions 145 and 147 may protrude from the second power rail 140 toward the third power rail 150 and may extend in the second direction D2 such that the each of the third and fourth branch portions 145 and 147 overlaps with each of the first and second power bridges 171 and 173 without reaching the third power rail 150. That is, the third and fourth branch portions 145 and 147 are spaced apart from the third power rail 150 in the second direction D2. The first through fourth branch portions 135, 137, 145 and 147 may be formed in the first metal layer M1 of the semiconductor device 10.

In addition, each width of the first and second branch portions 135 and 137 may be substantially the same as each width of the first and second power bridges 171 and 173, respectively, and each width of the third and fourth branch portions 145 and 147 may be substantially the same as each width of the first and second power bridges 171 and 173, respectively.

As described with reference to FIG. 4, each of the first and second branch portions 135 and 137 may be connected to each of the first and second power bridges 171 and 173 through contact plugs, each of the third and fourth branch portions 145 and 147 may be connected to each of the first and second power bridges 171 and 173 through contact plugs. When each of the first through fourth branch portions 135, 137, 145 and 147 is connected to each of the first and second power bridges 171 and 173, respectively, through contact plugs, each resistance of the first and second power bridges 171 and 173 may be reduced as in an embodiment in which resistors are connected in parallel.

The fifth and sixth branch portions 155 and 157 are spaced apart from each other in the first direction D1 in the standard cell 220. Each of the fifth and sixth branch portions 155 and 157 may protrude from the first power rail 130 toward the third power rail 150 and may extend in the second direction D2 such that the each of the fifth and sixth branch portions 155 and 157 overlaps with each of the third and fourth power bridges 181 and 183 without reaching the third power rail 150. That is, the fifth and sixth branch portions 155 and 157 are spaced apart from the third power rail 150 in the second direction D2. The seventh and eighth branch portions 165 and 167 are spaced apart from each other in the first direction D1 in the standard cell 220. Each of the seventh and eighth branch portions 165 and 167 may protrude from the second power rail 140 toward the third power rail 150 and may extend in the second direction D2 such that the each of the seventh and eighth branch portions 165 and 167 overlaps with each of the third and fourth power bridges 181 and 183 without reaching the third power rail 150. That is, the seventh and eighth branch portions 165 and 167 are spaced apart from the third power rail 150 in the second direction D2. The fifth through eighth branch portions 155, 157, 165 and 167 may be formed in the first metal layer M1 of the semiconductor device 10.

In addition, each width of the fifth and sixth branch portions 155 and 157 may be substantially the same as each width of the third and fourth power bridges 181 and 183, respectively, and each width of the seventh and eighth branch portions 165 and 167 may be substantially the same as each width of the third and fourth power bridges 181 and 183, respectively.

As described with reference to FIG. 4, each of the fifth and sixth branch portions 155 and 157 may be connected to each of the third and fourth power bridges 181 and 183 through contact plugs, each of the seventh and eighth branch portions 165 and 167 may be connected to each of the third and fourth power bridges 181 and 183 through contact plugs. When each of the fifth through eighth branch portions 155, 157, 165 and 167 is connected to each of the third and fourth power bridges 181 and 183, respectively, through contact plugs, each resistance of the third and fourth power bridges 181 and 183 may be reduced as in an embodiment in which resistors are connected in parallel.

Figure 6:
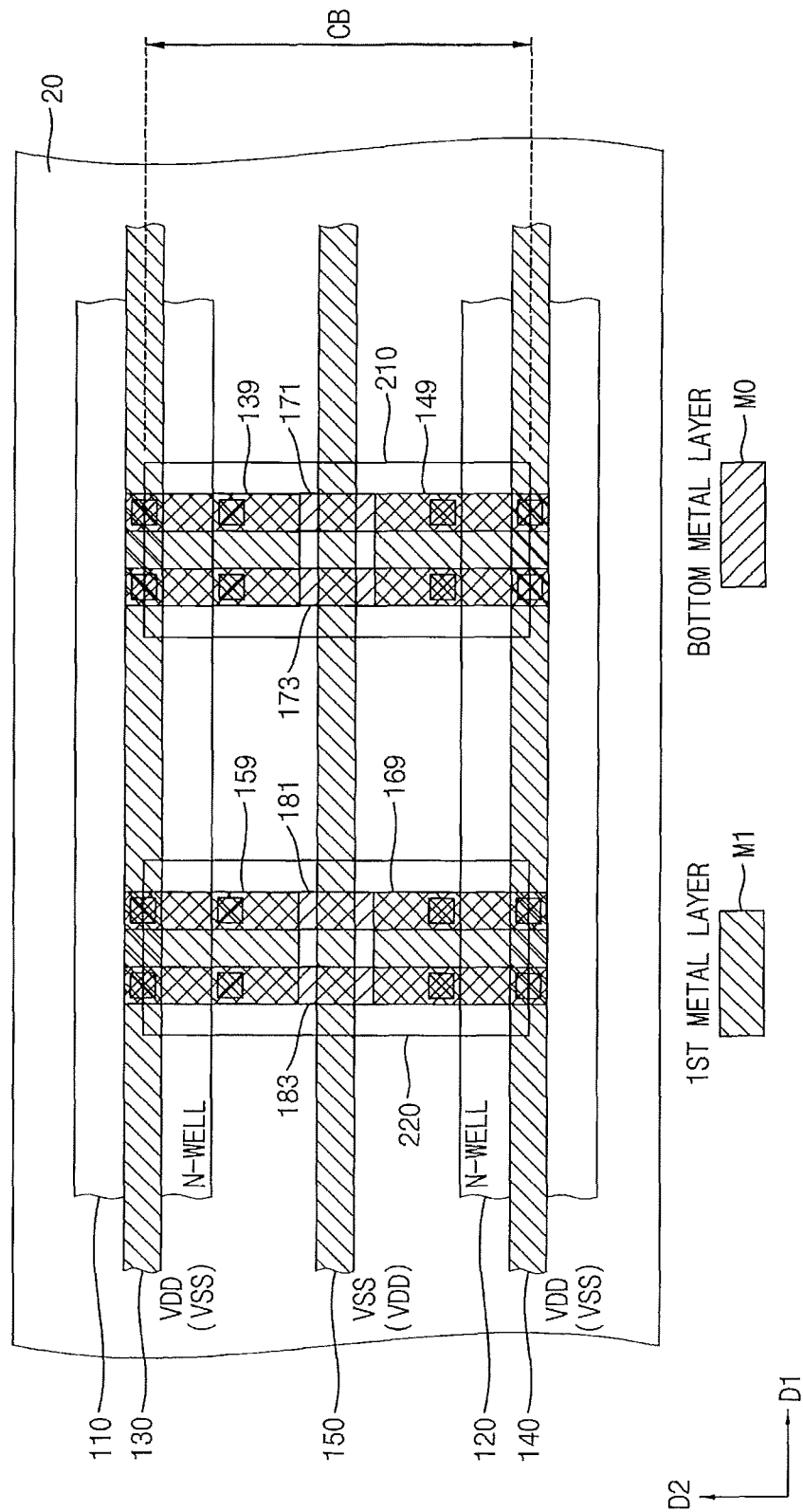
FIG. 6 illustrates a semiconductor device according to some example embodiments.

FIG. 6 illustrates a semiconductor device according to some example embodiments.

A semiconductor device 10c of FIG. 6 differs from the semiconductor device 10b of FIG. 5 in that the semiconductor device 10c includes a plurality of branch portions, for example, first and second branch portions 139 and 149 instead of the first through fourth branch portions 135, 137, 145 and 147 and a plurality of branch portions, for example, third and fourth branch portions 159 and 169 instead of fifth through eighth branch portions 155, 157, 165 and 167.

Referring to FIG. 6, the standard cell 210 may include a plurality of branch portions, for example, first and second branch portions 139 and 149, and the first and second power bridges 171 and 173 connect the first power rail 130 to the second power rail 140 in the standard cell 210. The third and fourth power bridges 181 and 183 connect the first power rail 130 to the second power rail 140 in the standard cell 220.

The first branch portion 139 may protrude from the first power rail 130 toward the third power rail 150 and may extend in the second direction D2 such that the first branch portion 139 overlaps with both of the first and second power bridges 171 and 173 and extends between the first and second power bridges 171 and 173 without reaching the third power rail 150 in the standard cell 210. That is, the first branch portion 139 is spaced apart from the third power rail 150 in the second direction D2. The second branch portion 149 may protrude from the second power rail 140 toward the third power rail 150 and may extend in the second direction D2 such that the second branch portion 149 overlaps with both of the first and second power bridges 171 and 173 and extends between the first and second power bridges 171 and 173 without reaching the third power rail 150 in the standard cell 210. That is, the second branch portion 149 is spaced apart from the third power rail 150 in the second direction D2. The first and second branch portions 139 and 149 may be formed in the first metal layer M1, and each width of the first and second branch portions 139 and 149 may be greater than each of the first and second power bridges 171 and 173.

The third branch portion 159 may protrude from the first power rail 130 toward the third power rail 150 and may extend in the second direction D2 such that the third branch portion 159 overlaps with both of the third and fourth power bridges 181 and 183 and extends between the third and fourth power bridges 181 and 183 without reaching the third power rail 150 in the standard cell 220. That is, the third branch portion 159 is spaced apart from the third power rail 150 in the second direction D2. The fourth branch portion 169 may protrude from the second power rail 140 toward the third power rail 150 and may extend in the second direction D2 such that the fourth branch portion 169 overlaps with both of the third and fourth power bridges 181 and 183 and extends between the third and fourth power bridges 181 and 183 without reaching the third power rail 150 in the standard cell 220. That is, the fourth branch portion 169 is spaced apart from the third power rail 150 in the second direction D2. The third and fourth branch portions 159 and 169 may be formed in the first metal layer M1, and each width of the third and fourth branch portions 159 and 169 may be greater than each of the third and fourth power bridges 181 and 183.

Figure 7:
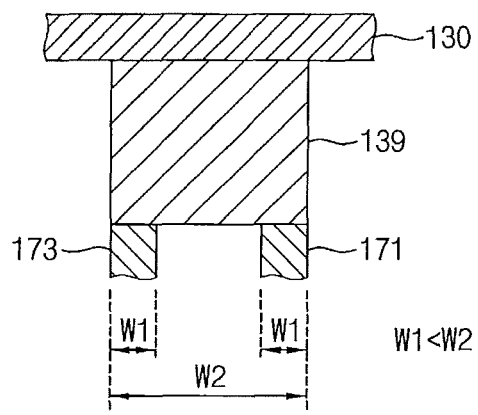
FIG. 7 illustrates power bridges and branch portions in the semiconductor device of FIG. 6.

FIG. 7 illustrates the first and second power bridges 171 and 173 and the first branch portion 139 in the semiconductor device of FIG. 6.

Referring to FIG. 7, each of the first and second power bridges 171 and 173 may have a first width W1, the branch portion 139 may have a second width W2 and the second width W2 may be greater than the first width W1. As described with reference to FIGS. 4 and 6, each of the first and second branch portions 139 and 149 may be connected to each of the first and second power bridges 171 and 173 through contact plugs and each resistance of the first and second power bridges 171 and 173 may be reduced.

Figure 8:
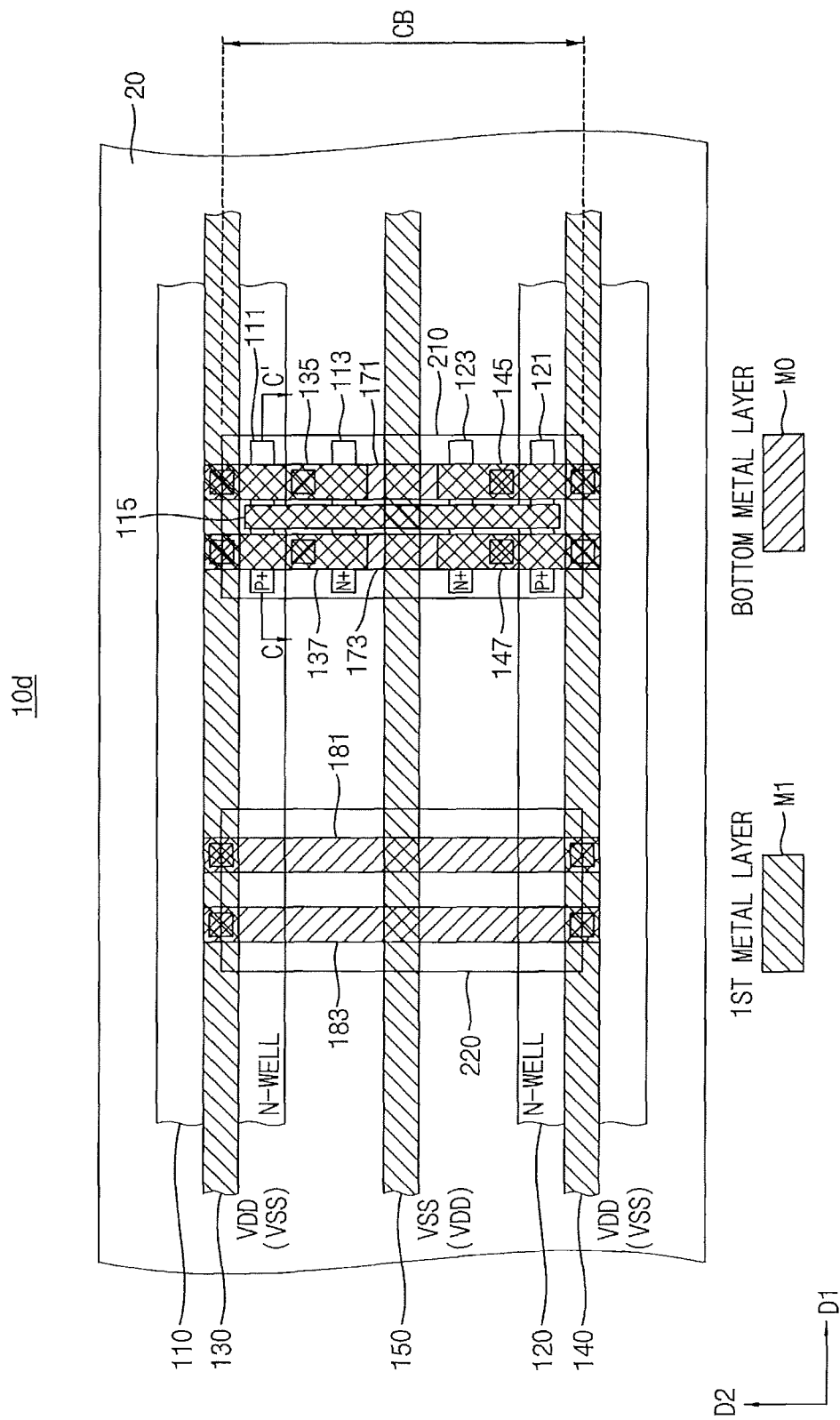
FIG. 8 illustrates a semiconductor device according to some example embodiments.

FIG. 8 illustrates a semiconductor device according to some example embodiments.

A semiconductor device 10d of FIG. 8 differs from the semiconductor device 10b of FIG. 5 in that the semiconductor device 10d further includes a plurality of impurity regions, for example, first through fourth impurity regions 111, 113, 121 and 123, and a gate electrode 115.

The first impurity region 111 may be formed in the first N-well 110, the second and fourth impurity regions 113 and 123 may be formed in the substrate 20 and the third impurity region 121 may be formed in the second N-well 120. The gate electrode 115 may be formed over the first through fourth impurity regions 111, 113, 121 and 123 and the gate electrode 115 may cross the first through fourth impurity regions 111, 113, 121 and 123 in the second direction D2. The first and third impurity regions 111 and 121 may include a first conductive type impurity, that is, a p-type impurity and the second and fourth impurity regions 113 and 123 may include a second conductive type impurity, that is, an n-type impurity. Therefore, the gate electrode 115 and the first impurity region 111 may constitute a p-channel metal-oxide semiconductor (PMOS) transistor, the gate electrode 115 and the second impurity region 113 may constitute an n-channel metal-oxide semiconductor (NMOS) transistor, the gate electrode 115 and the fourth impurity region 123 may constitute an NMOS transistor and the gate electrode 115 and the third impurity region 121 may constitute a PMOS transistor. That is, the standard cell 210 may include four metal-oxide semiconductor (MOS) transistors.

The gate electrode 115 may include, for example, a conductive material. In some example embodiments, the gate electrode 115 may include polysilicon. In some example embodiments, the gate electrode 115 may include a metal.

At least one standard cell 210 may include the first power rail 130, the second power rail 140, the third power rail 150, the first through fourth impurity regions 111, 113, 123 and 121 and the gate electrode 115.

Figure 9:
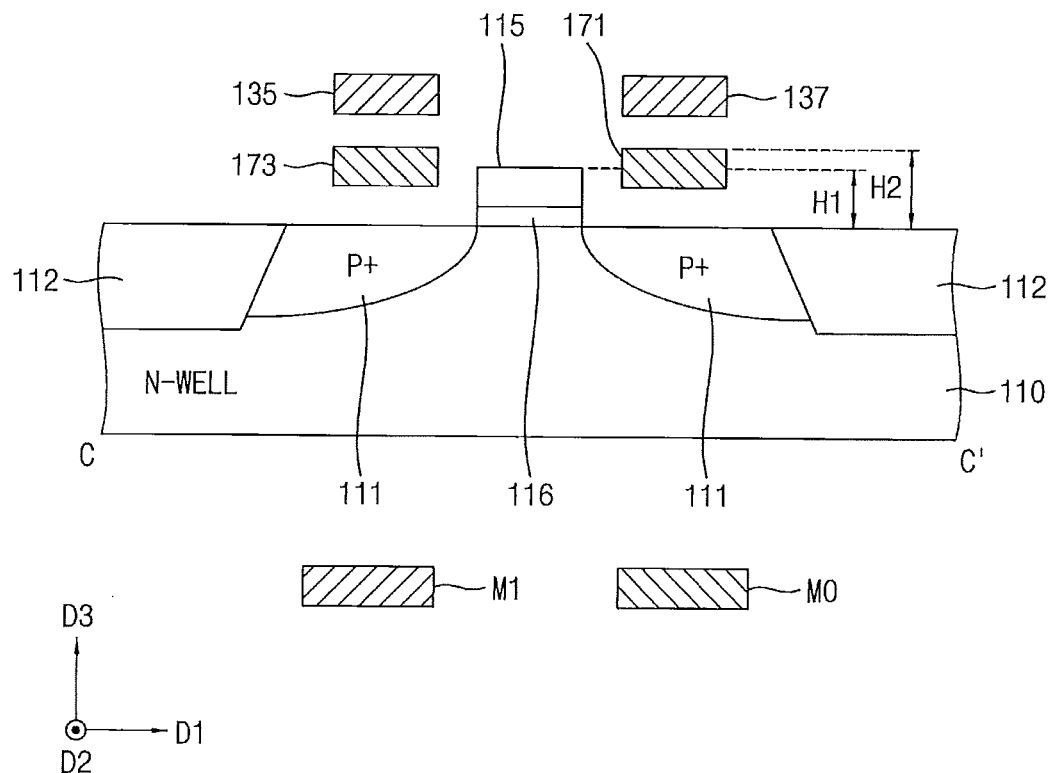
FIG. 9 is a cross-sectional view taken along the line C-C' of the semiconductor device of FIG. 8.

FIG. 9 is a cross-sectional view taken along the line C-C' of the semiconductor device of FIG. 8.

Referring to FIGS. 8 and 9, the first N-well 110 is formed in the substrate 20 having a first conductive type, and the first impurity region 111 is formed in the first N-well 110. A gate insulating layer 116 may be formed between the gate electrode 115 and the N-well 110. The gate insulating layer 116 may be formed of, for example, an oxide layer. In some example embodiments, the gate insulating layer 116 may be formed of, but not limited to, $SiO_2$, $HfO_2$, $Al_2O_3$, $ZrO_2$, or $TaO_2$.

The impurity regions may be separated from each other by a device isolation layer 112. The device isolation layer 112 may include, for example, a shallow trench isolation (STI) layer. In some example embodiments, the device isolation layer 112 may also include a deep trench isolation (DTI) layer.

Although not illustrated, spacers may be formed on both sides of the gate electrode 115. In some embodiments, the spacers may include, for example, a nitride layer or a silicon nitride (SiN) layer.

The first and second power bridges 171 and 173 formed in the bottom metal layer M0 may partially overlap with the gate electrode 115 in the third direction D3 (that is, a direction perpendicular to the substrate 20) and may be formed higher than the gate electrode 115 from a surface of the substrate 20. A height H1 of a top surface of the gate electrode 115 is less than a height H2 of each top surface of the first and second power bridges 171 and 173. Each bottom surface of the first and second power bridges 171 and 173 is higher than a bottom surface of the gate electrode 115 from a surface of the substrate 20 and lower than a top surface of the gate electrode 115 from a surface of the substrate 20. The third direction D3 may be orthogonal to the first and second directions D1 and D2.

Figure 10:
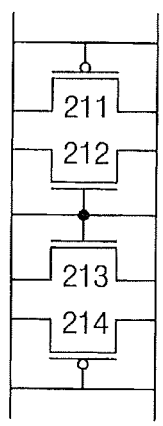
FIG. 10 is a circuit diagram illustrating a standard cell in the semiconductor device of FIG. 8.

FIG. 10 is a circuit diagram illustrating the standard cell 210 in the semiconductor device of FIG. 8.

Referring to FIGS. 8 and 10, the gate electrode 115 and the first impurity region 111 may constitute a PMOS transistor 211, the gate electrode 115 and the second impurity region 113 may constitute an NMOS transistor 212, the gate electrode 115 and the fourth impurity region 123 may constitute an NMOS transistor 213, and the gate electrode 115 and the third impurity region 121 may constitute a PMOS transistor 214. Since a source and a drain of each of the transistors 211~214 are coupled to each other, the transistors 211~214 may operate as a decoupling capacitor in the semiconductor device 10d.

Figure 11:
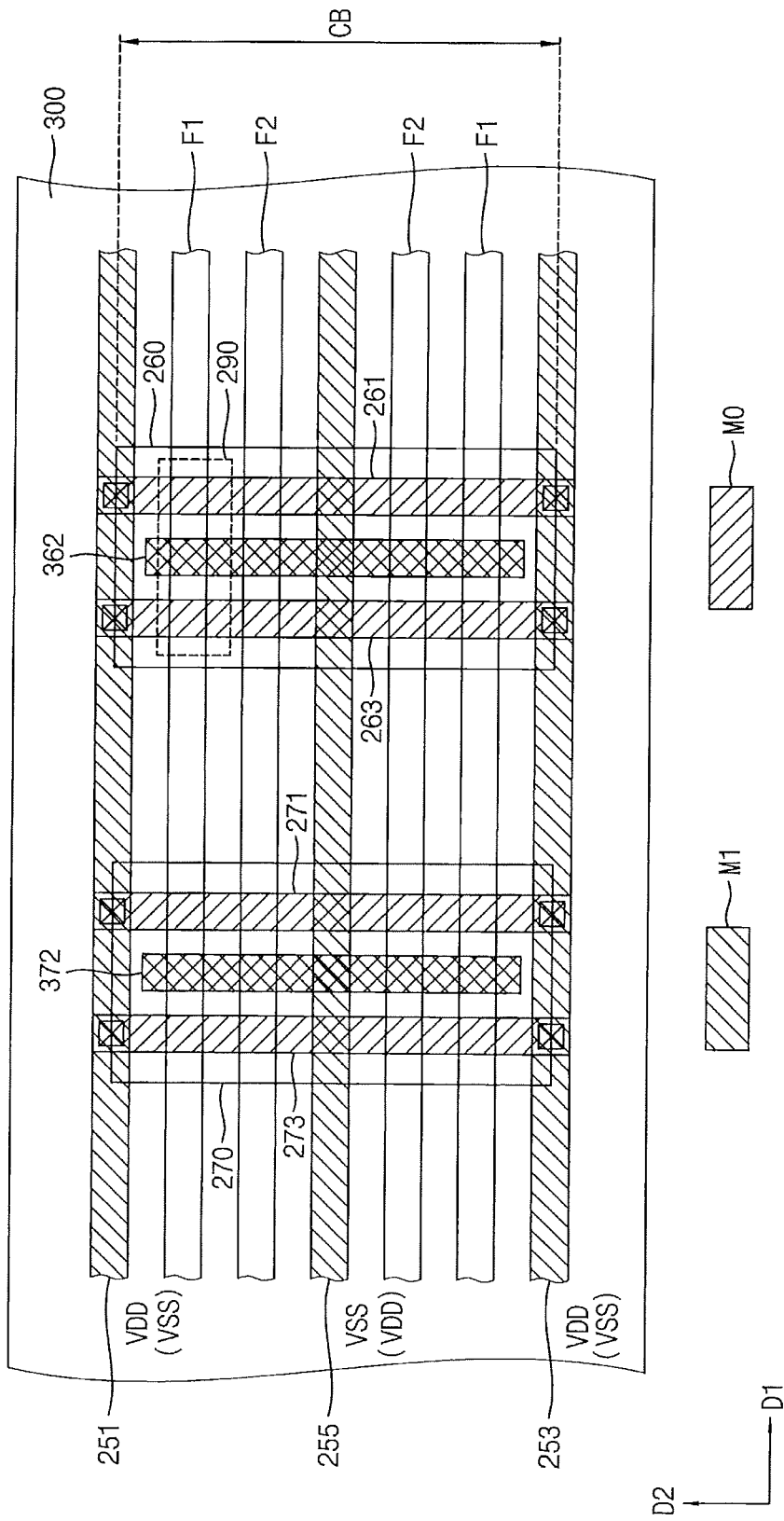
FIG. 11 illustrates a semiconductor device according to some example embodiments.
Figure 12:
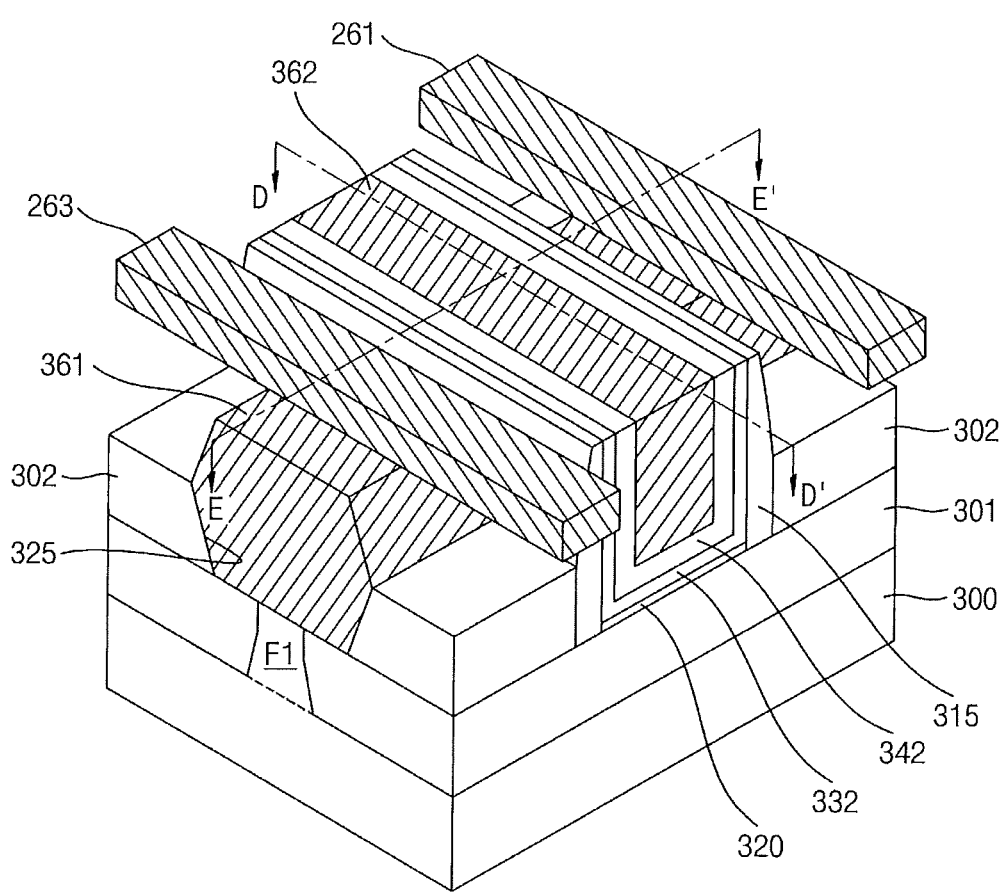
FIG. 12 is a partial perspective view of a portion of the semiconductor device of FIG. 11.

FIG. 11 illustrates a semiconductor device 50 according to some example embodiments and FIG. 12 is a partial perspective view of a portion 290 of the semiconductor device of FIG. 11.

Figure 13:
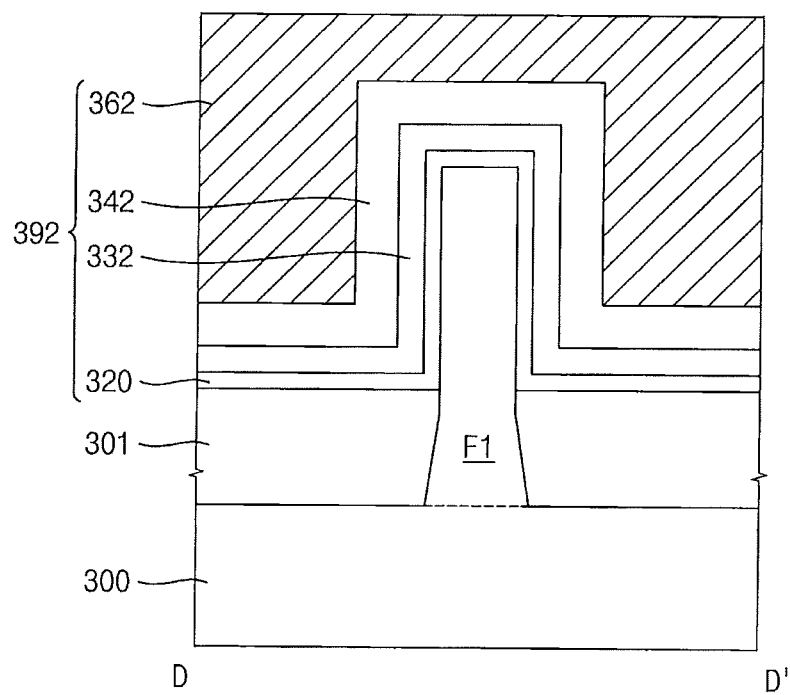
FIG. 13 is a cross-sectional view taken along the line D-D' of the semiconductor device of FIG. 12.

FIG. 13 is a cross-sectional view taken along the line D-D' of the semiconductor device of FIG. 12.

Figure 14:
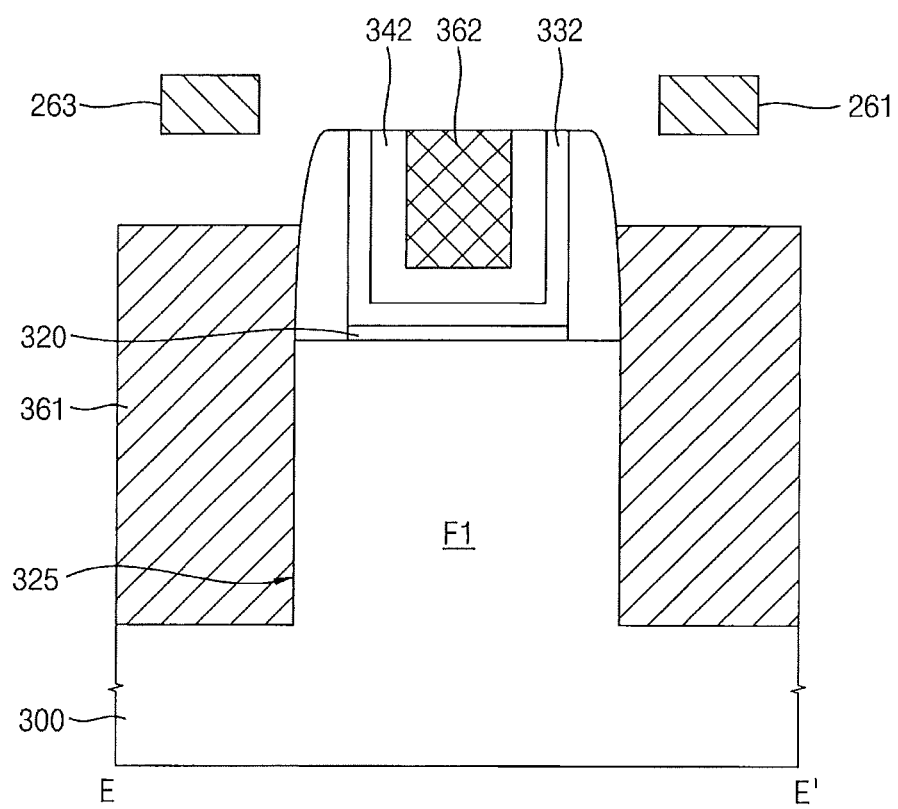
FIG. 14 is a cross-sectional view taken along the line E-E' of the semiconductor device of FIG. 12.

FIG. 14 is a cross-sectional view taken along the line E-E' of the semiconductor device of FIG. 12.

An embodiment in which the semiconductor device 50 includes fin transistors (FinFETs) will hereinafter be described as an example. However, example embodiments are not limited to this example embodiment. Example embodiments are also applicable to a semiconductor device including three-dimensional semiconductor elements (for example, transistors using nanowires) instead of fin transistors.

Referring to FIGS. 11 through 14, the semiconductor device 50 may include a substrate (active layer) 300, a first power rail 251, a second power rail 253, a third power rail 255, first and second standard cells 260 and 270 and first through fourth power bridges 261, 263, 271 and 273.

The first power rail 251 extends in a first direction D1 over the substrate 300. The second power rail 253 extends in the first direction D1 over the substrate 300 and is spaced apart from the first power rail 251 by a predetermined distance in a second direction D2 that intersects the first direction D1. The second direction is substantially perpendicular to the first direction. The third power rail 255 extends in the first direction D1 between the first power rail 251 and the second power rail 253 such that the third power rail 255 is spaced apart from the first and second power rails 251 and 253 in the second direction D2. The first through third power rails 251, 253 and 255 are may be formed in the first metal layer M1 in the semiconductor device 50.

Each of the standard cells 260 and 270 may have a cell boundary CB defined by the first power rail 251 and the second power rail 253. The cell boundary may be a boundary of first and second standard cells 260 and 270 along the first direction D1. The first and second power bridges 261 and 263 may connect the first power rail 251 to the second power rail 253 in the first standard cell 260 and the third and fourth power bridges 271 and 273 may connect the first power rail 251 to the second power rail 253 in the second standard cell 270. The first through fourth power bridges 261, 263, 271 and 273 may be formed in the bottom metal layer M0 formed under the first metal layer M1 in the semiconductor device 50.

When the first power rail 251 and the second power rail 253 are connected to each other using the first through fourth power bridges 261, 263, 271 and 273 formed in the bottom metal layer M0 without using upper metal layers formed above the first metal layer M1, signal routing capability of the semiconductor device 50 may be increased and manufacturing cost of the semiconductor device 50 may be reduced.

The semiconductor device 50 may further include first and second active fins F1 and F2 extending in the first direction D1.

The first and second active fins F1 and F2 may protrude from the active layer 300 (that is, the substrate) in a third direction D3. In some embodiments, the first and second active fins F1 and F2 may be formed by partially etching the active layer 300.

In some embodiments, the active layer 300 may be a semiconductor substrate. When the active layer 300 is a semiconductor substrate, the semiconductor substrate may be formed of one or more semiconductor materials selected from the group comprising Si, Ge, SiGe, GaP, GaAs, SiC, SiGeC, InAs, and InP.

In some embodiments, the active layer 300 may be an epitaxial layer formed of a semiconductor material. Here, the epitaxial layer may be formed on an insulating substrate. In other words, the active layer 300 may be an SOI substrate.

The first and second active fins F1 and F2 may extend in the first direction D1 and may be separated from each other in the second direction D2.

A pair of the active fins F1 and F2 may form a group. A first group of first and second active fins F1 and F2 may be positioned between the first power rail and the third power rail. A second group of active fins F1 and F2 may be positioned between the third power rail and the second power rail. This is because the two active fins F1 and F2 are formed from one dummy gate referred to as a mandrel. In some embodiments, N-wells may be formed in the active fins F1 and F2.

A device isolation layer 301 may cover side surfaces of each of the first and second active fins F1 and F2. Specifically, the device isolation layer 301 may cover a lower part of each of the first and second active fins F1 and F2 as shown in FIG. 13. The device isolation layer 301 may be, for example, an insulating layer. More specifically, the device isolation layer 301 may be, but is not limited to, a silicon oxide (SiO.sub.2) layer, a silicon nitride (SiN) layer, or a silicon oxynitride (SiON) layer.

In FIGS. 12 through 14, a cross-section of each of the first and second active fins F1 and F2 may be tapered, that is, may become wider from top to bottom. However, the cross-sectional shape of each of the first and second active fins F1 and F2 is not limited to the tapered shape. In some embodiments, each of the first and second active fins F1 and F2 may have a quadrangular cross-sectional shape. In some embodiments, each of the first and second active fins F1 and F2 may have a chamfered cross-sectional shape. That is, corners of each of the first and second active fins F1 and F2 may be curved.

A gate structure 392, as illustrated in FIG. 13, may be formed on each of the first and second active fins F1 and F2 to extend in the second direction D2. Spacers 315 may be disposed on both sides of the gate structure 392. The spacers 315 may be disposed on each of the first and second active fins F1 and F2 to extend in the second direction D2.

Transistors may be formed in part of each of the first and second active fins F1 and F2. Each of the transistors may include the gate structure 392, the spacers 315, and source/drain regions 361.

The gate structure 392 may include an interface layer 320, a gate insulating layer 332, a work function control layer 342, and a gate electrode 362 sequentially formed on each of the first and second active fins F1 and F2 to extend in the second direction D2.

The interface layer 320 may be disposed on the device isolation layer 301 and each of the first and second active fins F1 and F2 to extend in the second direction D2. The interface layer 320 may include, for example, a low-k material layer having a dielectric constant (k) of 9 or less, such as a silicon oxide layer (having a dielectric constant of approximately 4) or a silicon oxynitride layer (having a dielectric constant of approximately 4 to 8 depending on the content of oxygen atoms and nitrogen atoms). Alternatively, the interface layer 320 may be formed of silicate or a combination of the above example layers.

The gate insulating layer 332 may be disposed on the interface layer 320. Specifically, the gate insulating layer 332 may extend in the second direction D2 and partially cover an upper part of each of the first and second active fins F1 and F2. As illustrated in FIG. 14, the gate insulating layer 332 may extend upward along sidewalls of the spacers 315 disposed on both sides of the gate electrode 362. The gate insulating layer 332 is shaped as described above because it is formed by a replacement process (or a gate last process). However, example embodiments are not limited thereto, and the shape of the gate insulating layer 332 can vary as desired.

The gate insluting layer 332 may be formed of, for example, a high-k material. In some embodiments, the gate insulating layer 332 may be formed of, $HfO_2$, $Al_2O_3$, $ZrO_2$, $TaO_2$, or the like.

The work function control layer 342 may be disposed on the gate insulating layer 332. The work function control layer 342 may extend in the second direction D2 and partially cover the upper part of each of the first and second active fins F1 and F2. Like the gate insulating layer 332, the work function control layer 342 may extend upward along the sidewalls of the spacers 315. The work function control layer 342 may be a layer used to control the work function of a transistor. The work function control layer 342 may be at least one of an n-type work function control layer and a p-type work function control layer.

The gate electrode 362 may be disposed on the work function control layer 342. The gate electrode 362 may extend in the second direction D2 and partially cover the upper part of each of the first and second active fins F1 and F2.

The gate electrode 362 may include, for example, a highly conductive material. In some embodiments, the gate electrode 362 may include a metal. Examples of the metal may include, but are not limited to, Al and W.

Recess 325 may be formed in each of the first and second active fins F1 and F2 on both sides of the gate structure 392. The recess 325 may have sloping sidewalls. Thus, the recess 325 may become wider as the distance from the active layer 300 increases. As illustrated in FIG. 12, the recess 325 may be wider than the first and second active fins F1 and F2.

The source/drain regions (impurity regions) 361 may be formed in the recess 325, respectively. In some embodiments, the source/drain regions 361 may be elevated source/drain regions. That is, top surfaces of the source/drain regions 361 may be higher than top surfaces of the first and second active fins F1 and F2. In addition, the source/drain regions 361 may be insulated from the gate structure 392 by the spacers 315.

In an example embodiment of a p-channel transistor, the source/drain regions 361 may include, for example, a compressive stress material. The compressive stress material may be a material (for example, SiGe) having a greater lattice constant than Si. The compressive stress material can improve the mobility of carriers in a channel region by applying compressive stress to each of the first and second active fins F1 and F2. In some embodiments, the source/drain regions 361 formed on the first active fin F1 may include the compressive stress material.

In an embodiment of an n-channel transistor, the source/drain regions 361 may include, for example, the same material as the active layer 300 or a tensile stress material. For example, when the active layer 300 includes Si, the source/drain regions 361 may include Si or a material (for example, SiC) having a smaller lattice constant than Si. In some embodiments, the source/drain regions 361 formed on the second active fin F2 may include the tensile stress material.

In some example embodiments, the recess 325 is formed in each of the first and second active fins F1 and F2, and the source/drain regions 361 are formed in the recesses 325. However, example embodiments are not limited thereto. In some embodiments, the source/drain regions 361 may be formed in each of the first and second active fins F1 and F2 by injecting impurities directly into each of the first and second active fins F1 and F2.

Although only part of an interlayer insulating film 302 is illustrated in FIG. 12 for ease of understanding, the interlayer insulating film 302 may cover the source/drain regions 361 and the gate structure 392. In addition, in FIGS. 12 and 14, the first and second power bridges 261 and 263 formed in the bottom metal layer M0, which connect the first power rail 215 to the second power rail 253. The first and second power bridges 161 and 163 may partially overlap with the gate electrode 115 in the third direction D3 and may be formed higher than the gate electrode 115 from a surface of the substrate 300. That is, each bottom surface of the first and second power bridges 161 and 163 is higher than a bottom surface of the gate electrode 115 from a surface of the substrate 300 and lower than a top surface of the gate electrode 115 from a surface of the substrate 300.

Figure 15:
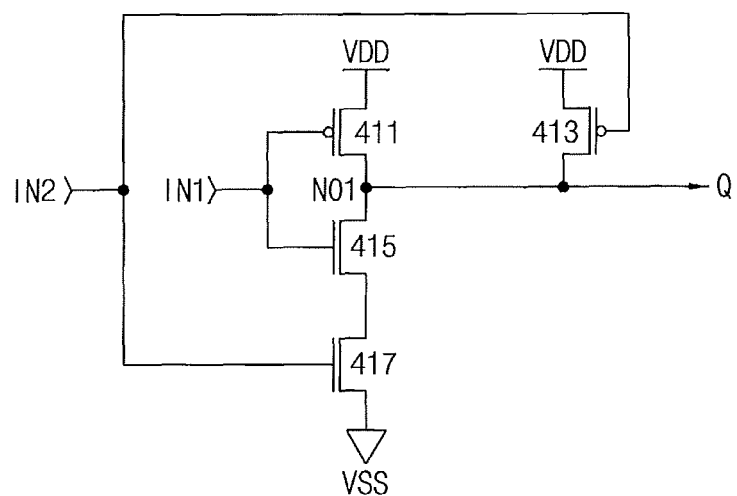
FIG. 15 illustrates a logic gate that employs the semiconductor device according to some of the example embodiments.

FIG. 15 illustrates a logic gate that employs the semiconductor device according to some example embodiments.

In FIG. 15 a two-input NAND gate is taken for example, which using the standard cells illustrated in connection with FIGS. 1 through 14.

Referring to FIG. 15, a NAND gate 400 may include first and second PMOS transistors 411 and 413 and first and second NMOS transistors 415 and 417. The first and second PMOS transistors 411 and 413 may be connected in parallel between a power supply voltage (node) VDD and first node NO1, and the first and second NMOS transistors 415 and 417 may be connected between the first node NO1 and the ground voltage (node) VSS.

The first PMOS transistor 411 has a source coupled to the power supply voltage VDD and a drain coupled to the first node NO1 and the second PMOS transistor 413 has a source coupled to the power supply voltage VDD and a drain coupled to the first node NO1. The first NMOS transistor 415 has a drain coupled to the first node NO1 and a source coupled to the second NMOS transistor 417 and the second NMOS transistor 417 has a drain coupled to the first NMOS transistor 415 and a source coupled to the ground voltage VSS. A first input signal IN1 is applied to gates of the first PMOS transistor 411 and the first NMOS transistor 415, a second input signal IN2 is applied to gates of the second PMOS transistor 413 and the second NMOS transistor 417, and an output signal Q is provided at the first node NO1.

The NAND gate 400 may employ at least one of the semiconductor devices 10, 10a, 10b, 10c, 10d and 50 described above. A first power rail supplying the power supply voltage VDD to the first PMOS transistor 411 and a second power rail supplying the power supply voltage VDD to the second PMOS transistor 413 may be formed in a first metal layer, and the first power rail and the second power rail may be connected to each other through at least one power bridge formed in a bottom metal layer formed under the first metal layer. In addition, a third power rail supplying the ground voltage VSS to the first NMOS transistor 415 and a fourth power rail supplying the ground voltage VSS to the second NMOS transistor 417 may be formed in the first metal layer, and the third power rail and the fourth power rail may be connected to each other through at least one power bridge formed in the bottom metal layer formed under the first metal layer.

Figure 16:
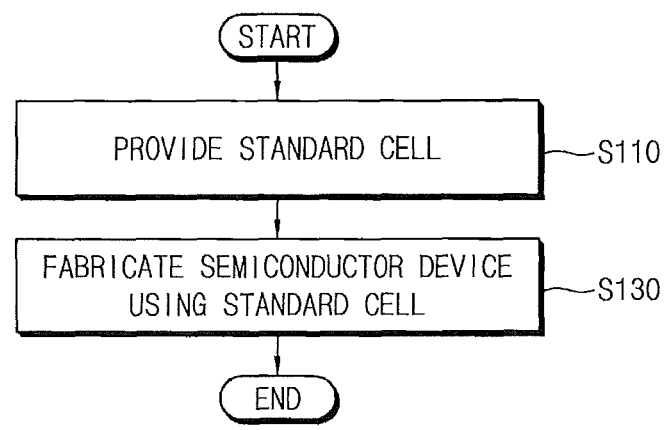
FIG. 16 is a flowchart illustrating a method of fabricating a semiconductor device according to some example embodiments.

FIG. 16 is a flowchart illustrating a method of fabricating a semiconductor device according to some example embodiments.

Referring to FIG. 16, in order to fabricate a semiconductor device, a standard cell is provided (S110). The standard cell may have a layout of one of the semiconductor devices 10, 10a, 10b, 10c, 10d and 50 described in connection with FIGS. 1 through 14. The provided standard cell includes a plurality of transistors, a first power rail and a second power rail. The first and second power rails are spaced apart from each other and supply power supply voltage to the plurality of transistors. The first and second power rails may be formed in a first metal layer and the first and second power rail may be connected to each other through at least one power bridge formed in a bottom metal layer formed under the first metal layer.

Referring back to FIG. 16, a semiconductor device may be fabricated using the provided standard cell (S130). Specifically, using the provided standard cell, a deposition process, an etching process, and/or the like are performed on a semiconductor substrate using the provided standard cell. As a result, any one of the semiconductor devices 10, 10a, 10b, 10c, 10d and 50 described in connection with FIGS. 1 through 14 may be fabricated.

Figure 17:
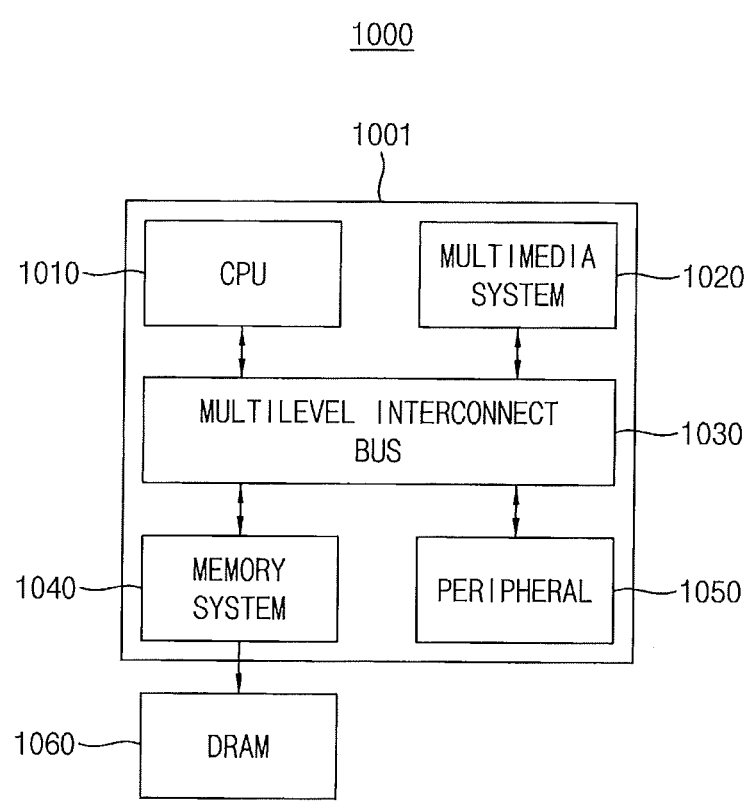
FIG. 17 is a block diagram illustrating a system-on-chip (SoC) system including semiconductor devices according to some example embodiments.
Figure 18:
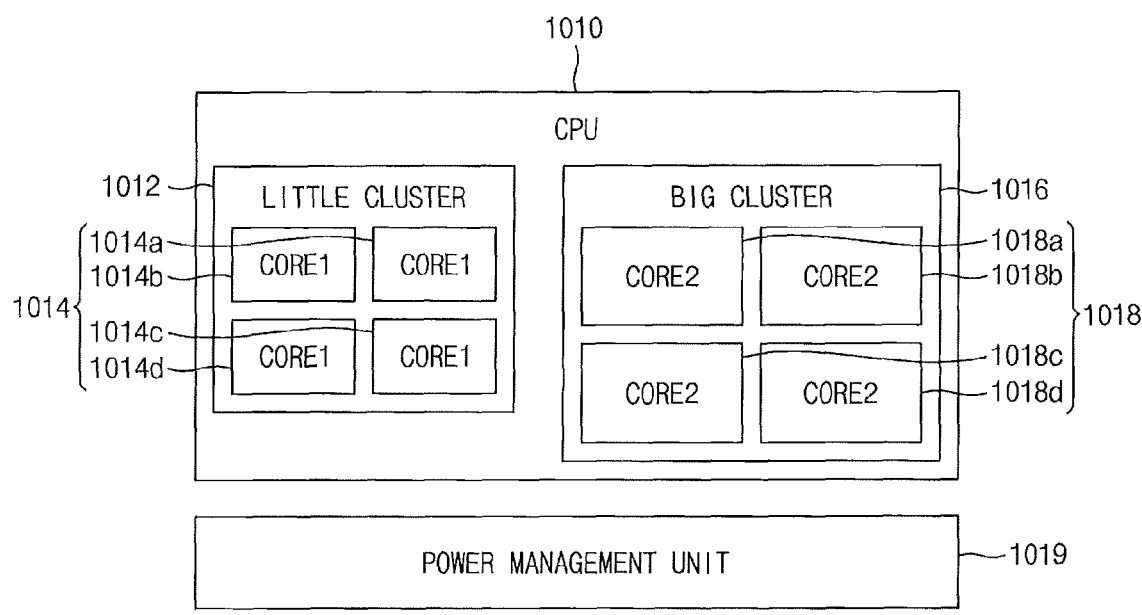
FIG. 18 is a block diagram of a CPU in FIG. 17.
Figure 19:
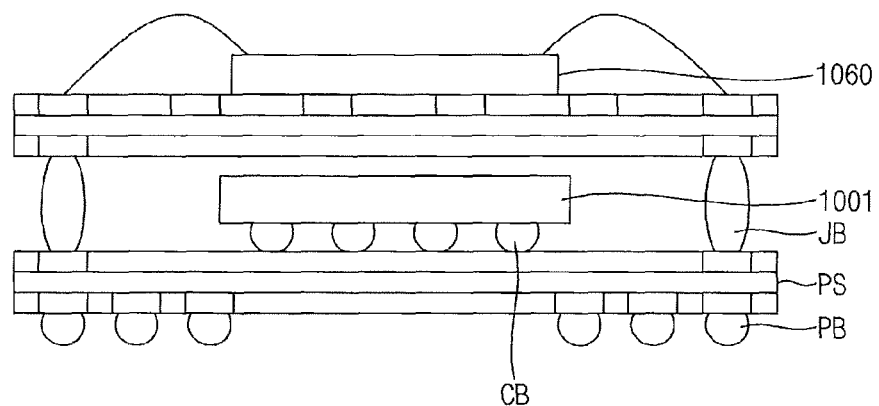
FIG. 19 illustrates the SoC of FIG. 17 after being packaged.

FIG. 17 is a block diagram illustrating a system-on-chip (SoC) system 1000 including semiconductor devices according to some example embodiments. FIG. 18 is a block diagram of a CPU 1010 of FIG. 18. FIG. 19 illustrates the SoC 1000 of FIG. 17 after being packaged.

Referring to FIG. 17, the SoC system 1000 includes an application processor 1001 and a dynamic random access memory (DRAM) 1060.

The application processor 1001 may include the CPU 1010, a multimedia system 1020, a bus 1030, for example, a multilevel interconnect bus, a memory system 1040, and a peripheral circuit 1050.

The CPU 1010 may perform operations needed to drive the SoC system 1000. In some embodiments, the CPU 1010 may be configured as a multi-core environment including a plurality of cores.

In some example embodiments, the CPU 1010 may include a first cluster 1012 and a second cluster 1016 as illustrated in FIG. 18.

The first cluster 1012 may be placed in the CPU 1010 and include n (where n is a natural number) first cores 1014. In FIG. 18, for ease of description, an embodiment in which the first cluster 1012 includes four (that is, n=4) first cores 1014a, 1014b, 1014c and 1014d will be described as an example. However, example embodiments are not limited to this example embodiment.

The second cluster 1016 may also be placed in the CPU 1010 and include n second cores 1018. The second cluster 1016 may be separated from the first cluster 1012. For ease of description, an embodiment in which the second cluster 1016 includes four (that is, n=4) second cores 1018a, 1018b, 1018c and 1018d will be described as an example. However, example embodiments are not limited to this example embodiment.

In FIG. 18, the number of the first cores 1014 included in the first cluster 1012 is equal to the number of the second cores 1018 included in the second cluster 1016. However, example embodiments are not limited thereto. In some embodiments, the number of the first cores 1014 included in the first cluster 1012 may be different from the number of the second cores 1018 included in the second cluster 1016.

The example embodiments may be employed in an electronic device including an NFC device. For example, the example embodiments may be applicable to a mobile phone, a smart phone, a personal digital assistant (PDA), a portable multimedia player (PMP), a digital camera, a music player, a portable game console, a navigation system, a laptop computer or the like.

In addition, in FIG. 18, only the first cluster 1012 and the second cluster 1016 are placed in the CPU 1010. However, example embodiments are not limited thereto. When necessary, a third cluster (not shown) which is separate from the first and second clusters 1012 and 1016 and includes third cores (not shown) may additionally be placed in the CPU 1010.

In the embodiment of FIG. 18, the amount of computation per unit time of the first cores 1014 included in the first cluster 1012 may be different from the amount of computation per unit time of the second cores 1018 included in the second cluster 1016.

In some embodiments, the first cluster 1012 may be a little cluster, and the second cluster 1016 may be a big cluster. In this embodiment, the amount of computation per unit time of the first cores 1014 included in the first cluster 1012 may be smaller than the amount of computation per unit time of the second cores 1018 included in the second cluster 1016.

Therefore, the amount of computation per unit time in an embodiment in which all first cores 1014 included in the first cluster 1012 are enabled to perform an operation may be smaller than the amount of computation per unit time in a case where all second cores 1018 included in the second cluster 1016 are enabled to perform an operation.

The respective amounts of computation per unit time of the (1-1)_th through (1-4)_th cores 1014a through 1014d included in the first cluster 1012 may be equal, and the respective amounts of computation per unit time of the (2-1)_th through (2-4)_th cores 1018a through 1018d included in the second cluster 1016 may be equal. That is, assuming that the amount of computation per unit time of each of the (1-1)_th through (1-4)_th cores 1014a through 1014d is 10, the amount of computation per unit time of each of the (2-1)_th through (2-4)_th cores 1018a through 1018d may be 40.

A power management unit 1019 may enable or disable the first cluster 1012 and the second cluster 1016 as necessary. Specifically, when an operation needs to be performed by the first cluster 1012, the power management unit 1019 may enable the first cluster 1012 and disable the second cluster 1016. Alternatively, when an operation needs to be performed by the second cluster 1016, the power management unit 1019 may enable the second cluster 1016 and disable the first cluster 1012. When the amount of computation required can be fully processed by the (1-1)_th core 1014a of the first cluster 1012, the power management unit 1019 may enable the first cluster 1014a and disable the second cluster 1016. Even within the first cluster 1012, the power management unit 1019 may enable the (1-1)_th core 1014a and disable the (1-2)_th through (1-4)_th cores 1014b through 1014d. That is, the power management unit 1019 may determine whether to enable the first cluster 1012 and the second cluster 1016 and may also determine whether to enable each of the (1-1)_th through (1-4)_th cores 1014a through 1014d included in the first cluster 1012 and each of the (2-1)_th through (2-4)_th cores 1018a through 1018d included in the second cluster 1016.

In some embodiments, the power management unit 1019 may enable the first and second clusters 1012 and/or the cores 1014a through 1014d and 1018a through 1018d included in the first and second clusters 1012 and 1016, respectively, by supplying power to the first and second clusters 1012 and/or the cores 1014a through 1014d and 1018a through 1018d included in the first and second clusters 1012 and 1016, respectively. In addition, the power management unit 1019 may disable the first and second clusters 1012 and/or the cores 1014a through 1014d and 1018a through 1018d included in the first and second clusters 1012 and 1016, respectively, by cutting the power supply to the first and second clusters 1012 and/or the cores 1014a through 1014d and 1018a through 1018d included in the first and second clusters 1012 and 1016, respectively.

The power management unit 1019 may enable only a specific cluster 1012 or 1016 and/or the cores 1014a through 1014d or 1018a through 1018d included in the specific cluster 1012 or 1016, respectively, according to the operating environment of the SoC system 1000, thereby managing the power consumption of the entire SoC system 1000.

Referring back to FIG. 17, the multimedia system 1020 may be used to perform various multimedia functions in the SoC system 1000. The multimedia system 1020 may include a 3D engine module, a video codec, a display system, a camera system, a post-processor, and/or the like.

The bus 1030 may be used for data communication among the CPU 1010, the multimedia system 1020, the memory system 1040 and the peripheral circuit 1050. In some embodiments, the bus 1030 may have a multilayer structure. Specifically, the bus 1030 may be, but is not limited to, a multilayer advanced high-performance bus (AHB), a multilayer advanced extensible interface (AXI) or the like.

The memory system 1040 may provide an environment needed for the application processor 1001 to be connected to an external memory (for example, the DRAM 1060) and operate at high speed. In some embodiments, the memory system 1040 may include a controller (for example, a DRAM controller) needed to control the external memory (for example, the DRAM 1060).

The peripheral circuit 1050 may provide an environment needed for the SoC system 1000 to smoothly connect to an external device (for example, a mainboard). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some embodiments, the DRAM 1060 may be placed outside the application processor 1001. Specifically, in some embodiments, the DRAM 1060 may be packaged with the application processor 1001 in the form of package on package (PoP) as shown in FIG. 19.

Referring to FIG. 19, the semiconductor package may include a package substrate PS, the DRAM 1060, and the application processor 1001.

The package substrate PS may include a plurality of package balls PB. The plurality of package balls PB may be electrically connected to chip balls CB of the application processor 1001 by signal lines within the package substrate PS and may be electrically connected to joint balls JB by signal lines within the package substrate PS.

The DRAM 1060 may be electrically connected to the joint balls JB by, for example, wire bonding.

The application processor 1001 may be disposed under the DRAM 1060. The chip balls CB of the application processor 1001 may be electrically connected to the DRAM 1060 by signal lines within the package substrate PS and the joint balls JB.

In FIG. 17, the DRAM 1060 is placed outside the application processor 1001. However, example embodiments are not limited thereto. When necessary, the DRAM 1060 may also be placed inside the application processor 1001.

Any one of the semiconductor devices 10, 10*a*, 10*b*, 10*c*, 10*d* and 50 described in connection with FIGS. 1 through 14 may be provided as any one of the elements of the SoC system 1000.

Figure 20:
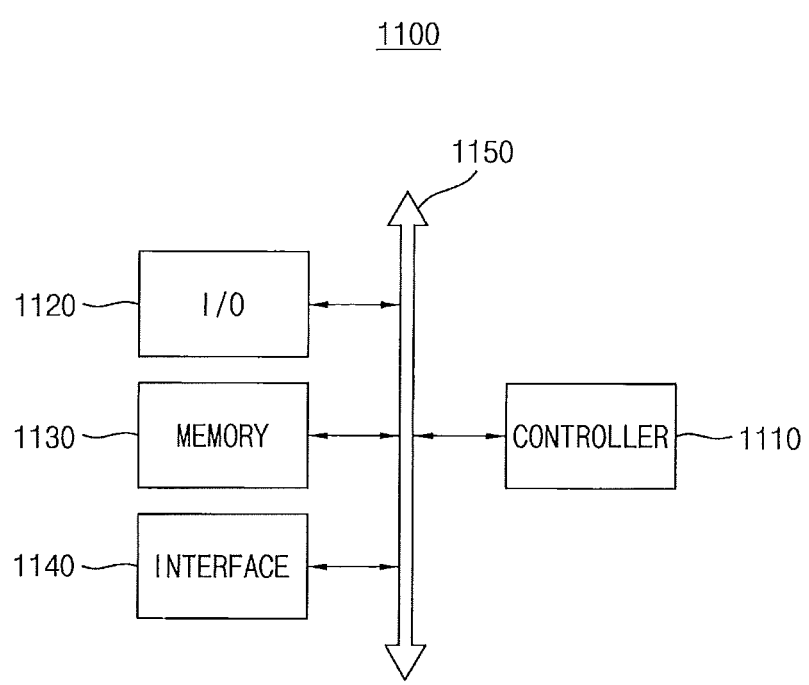
FIG. 20 is a block diagram illustrating an electronic system including semiconductor devices according to some example embodiments.

FIG. 20 is a block diagram illustrating an electronic system 1100 including semiconductor devices according to some example embodiments.

Referring to FIG. 20, the electronic system 1100 may include, for example, a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include, for example, at least one of a microprocessor, a digital signal processor, a microcontroller and logic devices capable of performing similar functions to those of a microprocessor, a digital signal processor, a microcontroller, and the like. The I/O device 1120 may include a keypad, a keyboard, a display device and the like. The memory device 1130 may store data and/or commands. The interface 1140 may be used to transmit data to or receive data from a communication network. The interface 1140 may be a wired or wireless interface. In an example embodiment, the interface 1140 may include an antenna or a wired or wireless transceiver.

Although not illustrated, the electronic system 1100 may be an operating memory for improving the operation of the controller 1110, and may also include a high-speed DRAM or SRAM. Any one of the semiconductor devices 10, 10*a*, 10*b*, 10*c*, 10*d* and 50 described in connection with FIGS. 1 through 14 may be employed as the operating memory. In addition, any one of the semiconductor devices 10, 10*a*, 10*b*, 10*c*, 10*d* and 50 described in connection with FIGS. 1 through 14 may be provided in the memory device 1130, in the controller 1110 and/or the I/O device 1120.

The electronic system 1100 may be applied to nearly all types of electronic products capable of transmitting or receiving information in a wireless environment, such as a PDA, a portable computer, a web tablet, a wireless phone, a mobile phone, a digital music player, a memory card, and the like.

Various example embodiments may be applied to semiconductor devices and systems including the semiconductor devices.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a first power rail extending in a first direction over a substrate having a first conductive type;
a second power rail extending in the first direction over the substrate, the second power rail being spaced apart from the first power rail by a predetermined distance in a second direction that intersects the first direction;
at least one standard cell receiving a first voltage from the first power rail and the second power rail; and
at least one power bridge configured to connect the first power rail and the second power rail in the second direction within the at least one standard cell,
wherein the first power rail and the second power rail are formed in a first metal layer and the least one power bridge is formed in a bottom metal layer that is under the first metal layer, and
wherein the at least one standard cell has a cell boundary defined by the first power rail and the second power rail.

2. The semiconductor device of claim 1, further comprising:
a third power rail extending in the first direction between the first power rail and the second power rail,
wherein the third power rail is formed in the first metal layer and the third power rail provides a second voltage different from the first voltage.

3. The semiconductor device of claim 2, further comprising:
at least one first branch portion protruding from the first power rail toward the third power rail, the at least one first branch portion extending in the second direction such that the at least one first branch portion is spaced apart from the third power rail in the second direction; and
at least one second branch portion protruding from the second power rail toward the third power rail, the at least one second branch portion extending in the second direction such that the at least one second branch portion is spaced apart from the third power rail in the second direction.

4. The semiconductor device of claim 3, wherein each width of the at least one first branch portion and the at least one second branch portion is substantially the same as a width of the at least one power bridge.

5. The semiconductor device of claim 4, wherein:
the at least one power bridge includes a first power bridge and a second power bridge that are spaced apart from each other in the first direction;
the at least one first branch portion includes a first branch portion and a second branch portion that are spaced apart from each other in the first direction; and
the at least one second branch portion includes a third branch portion and a fourth branch portion that are spaced apart from each other in the first direction.

6. The semiconductor device of claim 3, wherein each width of the at least one first branch portion and the at least one second branch portion is greater than a width of the at least one power bridge.

7. The semiconductor device of claim 3, wherein the at least one first branch portion is connected to the at least one power bridge through a first contact, the at least one second branch portion is connected to the at least one power bridge through a second contact, and the at least one first branch portion and the at least one second branch portion reduce a resistance of the at least one power bridge.

8. The semiconductor device of claim 1, further comprising:
a first well formed in the substrate, the first well having a second conductive type; and
a second well formed in the substrate separately from the first well, the second well having the second conductive type, wherein the first power rail is formed over the first well, and the second power rail is formed over the second well.

9. The semiconductor device of claim 8, wherein the first conductive type is p-type and the second conductive type is n-type.

10. The semiconductor device of claim 8, further comprising:
a first impurity region formed in the first well within the standard cell;
a second impurity region formed in the second well within the standard cell; and
a gate electrode crossing the first impurity region and the second impurity region in the second direction.

11. The semiconductor device of claim 10, wherein the at least one power bridge partially overlaps with the gate electrode in a third direction orthogonal to the first direction and the second direction, the at least one power bridge being formed higher than the gate electrode in the third direction.

12. The semiconductor device of claim 10, wherein the first impurity region, the second impurity region and the gate electrode constitute a plurality of transistors, and the plurality of transistors operate as a decoupling capacitor.

13. A semiconductor device, comprising:
a first power rail extending in a first direction over a substrate in a first metal layer;
a second power rail extending in the first direction over the substrate in the first metal layer, the second power rail being spaced apart from the first power rail in a second direction that intersects with the first direction;
a third power rail extending in the first direction over the substrate between the first power rail and the second power rail; and
at least one power bridge extending in the second direction in a second metal layer below the first metal layer and configured to connect the first and second power rails in at least one standard cell,
wherein the at least one standard cell has a cell boundary defined by the first power rail and the second power rail and receives a first voltage from the first power rail and the second power rail.

14. The semiconductor device of claim 13, wherein the third power rail is formed in the first metal layer and the third power rail provides a second voltage different from the first voltage.

15. The semiconductor device of claim 13, further comprising:
at least one first branch portion protruding from the first power rail toward the third power rail, the at least one first branch portion extending in the second direction such that the at least one first branch portion is spaced apart from the third power rail in the second direction; and
at least one second branch portion protruding from the second power rail toward the third power rail, the at least one second branch portion extending in the second direction such that the at least one second branch portion is spaced apart from the third power rail in the second direction.

16. The semiconductor device of claim 13, further comprising:
a first well formed in the substrate having a first conductive type, the first well having a second conductive type; and
a second well formed in the substrate separately from the first well, the second well having the second conductive type, wherein the first power rail is formed over the first well, and the second power rail is formed over the second well.

* * * * *